United States Patent [19]
Smith

[11] Patent Number: 5,937,025
[45] Date of Patent: Aug. 10, 1999

[54] HIGH SPEED CCD BUS STRUCTURE

[75] Inventor: Charles Smith, Waterloo, Canada

[73] Assignee: Dalsa, Inc., Canada

[21] Appl. No.: 08/917,363

[22] Filed: Aug. 26, 1997

Related U.S. Application Data

[60] Provisional application No. 60/042,328, Mar. 21, 1997.

[51] Int. Cl.⁶ .................................................. G11C 19/28
[52] U.S. Cl. ................................ 377/63; 377/61; 377/62; 257/249; 257/250
[58] Field of Search ................................ 257/249, 250; 377/57, 61, 62, 63, 78, 80

[56] References Cited

U.S. PATENT DOCUMENTS

| | | | |
|---|---|---|---|
| 4,347,656 | 9/1982 | Smith et al. | 438/587 |
| 4,951,302 | 8/1990 | Peter et al. | 377/57 |
| 5,194,751 | 3/1993 | Yonemoto et al. | 257/229 |
| 5,250,825 | 10/1993 | Negishi et al. | 257/232 |
| 5,255,099 | 10/1993 | Orihara | 348/311 |
| 5,256,890 | 10/1993 | Furukawa et al. | 257/233 |
| 5,386,384 | 1/1995 | Pedroni et al. | 377/62 |
| 5,399,888 | 3/1995 | Nakashiba | 257/233 |
| 5,502,319 | 3/1996 | Kim | 257/231 |

*Primary Examiner*—Margaret R. Wambach
*Attorney, Agent, or Firm*—Banner & Witcoff, Ltd.

[57] ABSTRACT

A CCD shift register includes a continuous buried channel over a length of the shift register, a plurality of conductor segments, a plurality of narrow bus segments, and a plurality of wide busses. Each conductor segment includes a plurality of sets of conductors, and each set of conductors includes plurality of conductors, each conductor in a set corresponding to a respective clock signal of a plurality of clock signals. Each conductor of each set extends across the buried channel. A first narrow bus segment of the plurality of narrow bus segments includes a plurality of narrow busses that are disposed parallel to and offset from the buried channel, each narrow bus corresponding to a respective clock signal of the plurality of clock signals, and each narrow bus is coupled to a respective conductor of each set of a first conductor segment. Each wide bus corresponds to a respective signal of the plurality of clock signals, and each wide bus is coupled to a respective narrow bus of the first narrow bus segment, each wide bus being more conductive than any narrow bus.

36 Claims, 9 Drawing Sheets

HIGH SPEED CCD BUS STRUCTURE

Priority benefit of U.S. application Ser. No. 60/042,328, filed Mar. 21, 1997, is claimed.

BACKGROUND OF THE INVENTION

1. Field of the Invention

The invention relates generally to horizontal readout registers of charge coupled device image sensors and specifically to structures that provide efficient distribution of high speed clock signals to such readout registers.

2. Description of Related Art

Charge couple devices (hereinafter CCDs) are widely used in video imaging and recording applications. An application of a CCD sensor is industrial inspection or vision equipment. The architecture of a CCD video sensor for this application may be optimized for maximum pixel resolution, or to maximize image frame rate, or both. Often inspection cameras used to inspect moving objects (e.g., on a continuous conveyor belt or rolled goods such as rolls of cloth) employ a line scan CCD sensor where a linear CCD sensor is oriented in a direction perpendicular to the direction of movement of the object being imaged. Advanced linear CCD sensor often employ an time delay and integrate technology and are referred to as TDI CCD sensors.

In FIG. 9, known TDI CCD sensor 100 includes imaging section 102 coupled through transfer gate 104 to horizontal CCD readout structure 106. Imaging section 102 includes a plurality of column registers (also called vertical CCD registers, VCCDs), each column including a plurality of photo-sites. In operation, a camera lens focuses an image conjugate on the TDI CCD sensor. The actual object, that forms image conjugate that is the optical input to the TDI CCD sensor, is moving (e.g., on a conveyor belt). Thus, an image conjugate focused on the sensor appears to be moving across the sensor. A portion of the image first appears on one pixel of the TDI CCD sensor, and then appear on another pixel of the sensor. The camera and sensor are arranged so that a portion of the moving image moves in a direction from the top of a column of photo-sites to the bottom of the column. The TDI CCD sensor is clocked to transfer charge down the columns of photo-sites at a rate equal to the rate that the portion of the image moves down the column. Charge generated at a first photo-site is transferred to the next photo-site at the same time that the image portion that generated the charge at the first photo-site moves to the next photo-site. In this way photo-charge is accumulated at the photo-site under the image portion as the image portion moves down the column. Thus the name, time delay and integrate (TDI).

In a TDI CCD sensor, the last pixel in each integrating column of photo-sites (i.e., the last horizontal line) is transferred into a horizontal CCD readout shift register (HCCD) through a plurality of transfer gates controlled by a transfer clock signal TCK, each transfer gate corresponding to a column of photo-sites. Signal TCK is usually generated by circuits external to the CCD sensor, provided at interface pad 108 of the CCD sensor and from there distributed through a bus to the gate electrode of each transfer gate.

Adjacent to the image region is a horizontal CCD shift register (HCCD shift register) 106 which transports the signal charge from the imaging pixels to the output buffer 110. It is not uncommon for this HCCD to require 3–5 control signals. A typical 4-phase HCCD requires five control signals: four to control charge transport along the HCCD (e.g., clock signals A, B, C, D) and one to control charge transfer (e.g., TCK) from the image pixels to the HCCD. These control signals must span the entire length of the image region.

Clock signals A through D are usually generated by circuits external to the CCD sensor, provided at interface pads 112, 114, 116 and 118, respectively, of the CCD sensor and from there distributed through busses to the gate electrodes that control the shifting of the HCCD shift register.

Those CCD sensors commonly referred to as linear sensors or TDI CCD sensors, typically have very long imaging regions. A typical high performance linear sensor has a 2.6 centimeter long image region consisting of 2,048 image pixels on a 13 micrometer pitch. This is not an extreme example; linear sensors longer than 6 centimeters are regularly fabricated.

An important limit to the maximum operating speed of a CCD is the propagation delay of the HCCD clocks along the length of the device. In a typical linear CCD, a clock signal, supplied from an external source to a bond pad on the die, is then distributed along a single metal bus spanning the length of the HCCD. The HCCD employs conductive poly-crystalline silicon (hereinafter poly-silicon) gate electrodes. These gate electrodes are connected to a metal bus along the length of the HCCD. Typically, the connection between the metal bus and the bond pad is made at only one end of the image sensor. For this case the propagation delay for the clock to reach the other end is given by $N^2$ RC where N is the number of HCCD elements, R is the incremental metal bus resistance along one HCCD element and C is the capacitance of one HCCD element. For typical values of R=0.07 Ω, C=100 fF, and N=1,024, the clock delay is 7.0 ns. The clock period should be at least four times the clock delay. Thus, this example has a maximum clock frequency of 35 MHz.

In addition to limiting maximum clock speed, the variation in clock delays along the CCD may degrade image quality by introducing a pixel-to-pixel non-uniformity. To prevent this degradation, it is desirable to have a clock delay much shorter than the clock transition time.

The present invention describes an alternative clock distribution structure that greatly reduces the clock delay to allow high speed operation without degradation in image quality.

SUMMARY OF THE INVENTION

It is an object of the invention to provide a clock distribution structure to permit fast shift operation of a CCD shift register. It is another object of the invention to provide a clock distribution structure to minimize clock signal bus resistance while minimizing capacitance at the end of the clock distribution structure.

These and other objects are achieved in a charge coupled device (CCD) shift register that includes a continuous buried channel over a length of the shift register, a plurality of conductor segments, a plurality of narrow bus segments, and a plurality of wide busses. Each conductor segment includes a plurality of sets of conductors, and each set of conductors includes plurality of conductors, each conductor in a set corresponding to a respective clock signal of a plurality of clock signals. Each conductor of each set extends across the buried channel. A first narrow bus segment of the plurality of narrow bus segments includes a plurality of narrow busses that are disposed parallel to and offset from the buried channel, each narrow bus corresponding to a respective clock signal of the plurality of clock signals, and each narrow bus is coupled to a respective conductor of each set of a first conductor segment. Each wide bus corresponds to a respective signal of the plurality of clock signals, and each wide bus is coupled to a respective narrow bus of the first narrow bus segment, each wide bus being more conductive than any narrow bus.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The invention employs two levels of busses to distribute the transport clock signals to the horizontal CCD shift register. The first level includes narrow metal-1 busses running the length of the HCCD. These busses are connected to the HCCD poly-silicon gate electrodes by poly-silicon interconnects. The busses are made narrow to minimize interconnect capacitance. The second level includes wider metal-2 busses also running the length of the HCCD. This metal-2 bussing is connected to the metal-1 bussing at regular intervals through vias. This interval is chosen to attain the required clock delay; a connection every 256 pixels typically achieves a sub-nanosecond clock delay. The metal-2 bus is made wide to reduce bus resistance.

The wide metal-2 bus may be formed adjacent to the narrow metal-1 bus with an extra thick isolation dielectric, such as silicon dioxide, disposed beneath the metal-2 bus. This isolation dielectric separates the wide metal-2 bus from the underlying substrate so that the capacitance per unit area is reduced compared with the capacitance experienced by the narrow metal-1 bus.

Another aspect of the invention involves re-ordering the narrow metal-1 busses in the different intervals or bus segments. Along the length of the HCCD shift register are plural segments of clock busses (e.g., eight). Each segment of clock busses necessarily has one clock phase closer to the buried channel (in which the shift register is formed) than the other phases. The farthest clock phase from the buried channel will require the longest poly-silicon conductor to connect the metal clock bus to the shift register gate electrode. The longer conductor has more capacitance than does a shorter conductor. Thus, within a segment of clock busses, one clock phase will be delayed more than another. However, plural segments of clock busses provide an opportunity to equalize the clock capacitances by cyclically assigning clock phases to the metal bus farthest from the buried channel. This improves overall video quality by reducing uneven distribution of clock capacitances.

Yet another aspect of the invention involves connecting the image-to-HCCD transfer clock, TCK, to one of the metal-2 busses. At high speed, mismatches between TCK and CR clock delays can degrade video quality.

Figure 1:
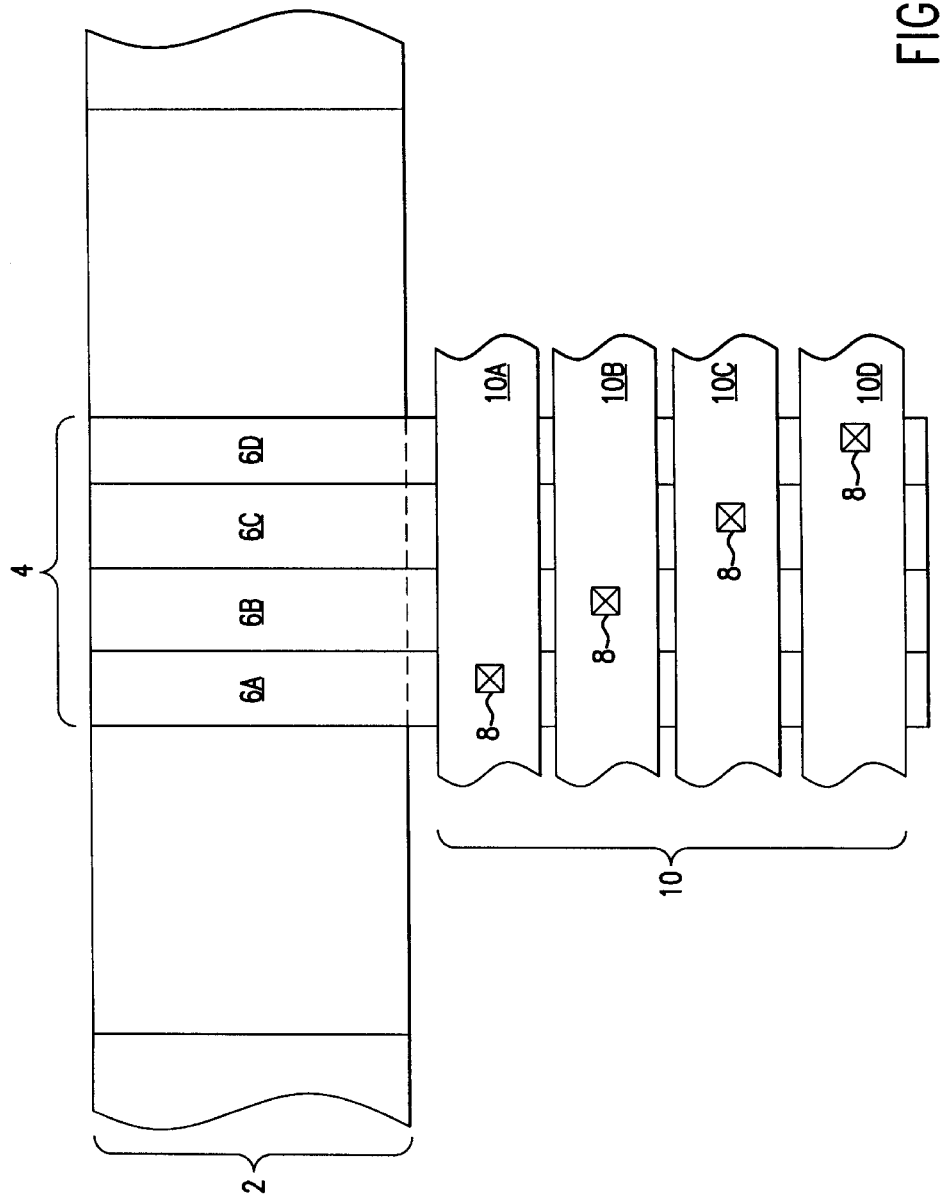
FIG. 1 is a layout diagram of a representative readout register element depicting the gate electrode to narrow metal-1 bus connection according to the present invention.

FIG. 1 depicts CCD shift register element 4 of a long shift register formed in buried channel 2. Buried channel 2 is typically an n-type semiconductor formed in a p-type substrate or an n-type semiconductor formed in a p-type well on an n-type substrate. Buried channel 2 is typically 20 to 25 micrometers wide.

Register element 4, as depicted in FIG. 1, is a four-phase CCD shift register element; however, two-phase and three-phase arrangements are equally benefited by this invention, and thus, are equivalent. The shift register element is formed under sets of gate electrodes depicted as 6A, 6B, 6C and 6D using known technology. Along a shift register are disposed plurality of these sets to form a segment (e.g., 16 of FIG. 3), and the shift register is formed from a plurality of these segments. Preferably, the gate electrodes 6A–6D are formed of conductive poly-silicon. An insulation layer (e.g., oxide) is formed over buried channel 2, and separate poly-silicon electrodes 6A–6D are formed over the insulation layer. It will be appreciated that each of the separate poly-silicon electrodes 6A–6D are insulated from one another so that they may carry separate clock signals A–D, respectively. Typically, each electrode (of the poly-silicon gate electrodes 6A–6D) is 4–5 micrometers wide. However, it is not uncommon for shift register element 4 to be two to three times taller than wide (i.e., pitch in the direction of charge transport).

Poly-silicon gate electrodes 6A–6D extend in their elongate direction over to the side of buried channel 2 by an extent ranging from 20 micrometers to 40 micrometers. Since this poly-silicon is conductive, it forms a general purpose conductor that functions as a gate electrode when disposed over buried channel 2 and as a general wiring conductor when not disposed over buried channel 2. While poly-silicon is conductive, it is not as conductive as metal, for example, aluminum. Moreover, the poly-silicon is disposed over a substrate with only a thin insulation layer between. Thus, the poly-silicon conductor is characterized by a relatively high capacitance per unit area. It is desirable to keep these poly-silicon conductors as short as possible to minimize capacitance.

A layer of insulation (for example, silicon dioxide) is disposed over the poly-silicon. Openings to form via connectors 8 are patterned in the insulation layer. Then, metal-1 clock busses are formed over the insulation layer so as to form via contacts 8 through the openings in the insulation layer with the poly-silicon conductor beneath. For example, poly-silicon gate electrode 6A is connected through via 8 to metal-1 bus 10A. Similarly, poly-silicon gate electrode 6B is connected to metal-1 bus 10B and so forth.

Metal-1 busses 10A–10D have a width of from 5 to 10 micrometers. Busses 10A–10D are considered narrow busses since their resistance is significant over the length of buried channel 2; however, in this invention, these narrow busses are cross strapped to wider busses to reduce this resistance. Each bus (of narrow metal-1 busses 10A–10D) extends in a "horizontal direction" parallel to buried channel 2, but is offset from buried channel 2. It would be possible to dispose clock busses 10A–10D (collectively, clock busses 10) over buried channel 2; however, this has undesirable effects. Aluminum via contacts 8 tend to diffuse into the poly-silicon conductor, and sometimes into the insulation layer (e.g., an oxide) beneath the poly-silicon conductor. While tungsten does not diffuse as aggressively, it is undesirable as a bus material since it has higher resistance per square. If an aluminum via contact were disposed over buried channel 2, then a potential of a well formed in the buried channel would be altered. This could reduce charge transfer efficiency and result in some of the charge being left behind at the via's position when the clocking signals are commanding charge to be transferred through the CCD shift register formed in buried channel 2. Furthermore, when charge is transferred from a vertical shift register through a transfer gate to a horizontal shift register (see FIGS. 5 and 6), the transfer efficiency may be effected by the proximity of a via contact. When a full image sensor or a TDI CCD sensor is fabricated, it is desirable for each vertical register in the image to transfer charge to the horizontal register with the same charge transfer efficiency as all vertical registers. Vias located over buried channel 2 distort well potential in the shift register formed in the buried channel giving the resulting image the effect of vertical streaks or lines. For these and other reasons, design rules for processes used by many fabrication foundries often require offset busses 10.

Even though busses 10 are offset, it is desirable to keep busses 10 as close as possible to, but offset from, buried channel 2 in order to minimize capacitance and resistance attributable to poly-silicon conductor. Poly-silicon conductors are formed over, but insulated from, the substrate or buried channel. The insulation layer between the poly-silicon and either the substrate or the buried channel is made thin in order to provide a sensitive response to signals applied to gate electrodes. This thin insulation layer gives the poly-silicon conductor a high capacitance per unit area. Furthermore, in multi-phase clocking structures formed from poly-silicon gate electrodes, each individual gate electrode is insulated from the other gate electrodes, and the gate electrodes normally have slightly overlapping edges. This structure produces a mutual capacitance between the gate electrodes and between conductors that are disposed parallel and close to each other. The capacitance experienced by the poly-silicon conductors slow the delivery of clock signals to the CCD shift register and limits the shift rate. It is therefore desirable to minimize the length of poly-silicon conductor. This is achieved by using minimum width, but offset, clock busses 10 so that they can be grouped closely together and disposed close to buried channel 2 to minimize the length of poly-silicon conductor.

Often, the length of the CCD shift register formed in buried channel 2 is comparatively long, defined as being sufficiently long so that the resistance in clock busses 10 becomes significant. Wider embodiments of clock busses 10 would reduce the resistance in busses 10; however, this would necessarily increase the poly-silicon conductor length and therefore its capacitance. The resistance of busses 10 and the capacitance of poly-silicon conductors 6 form a low pass RC filter. Furthermore, different phases of the clock signal will experience different amounts of signal delay due to different capacitances of poly-silicon conductors 6A–6D.

Figure 2:
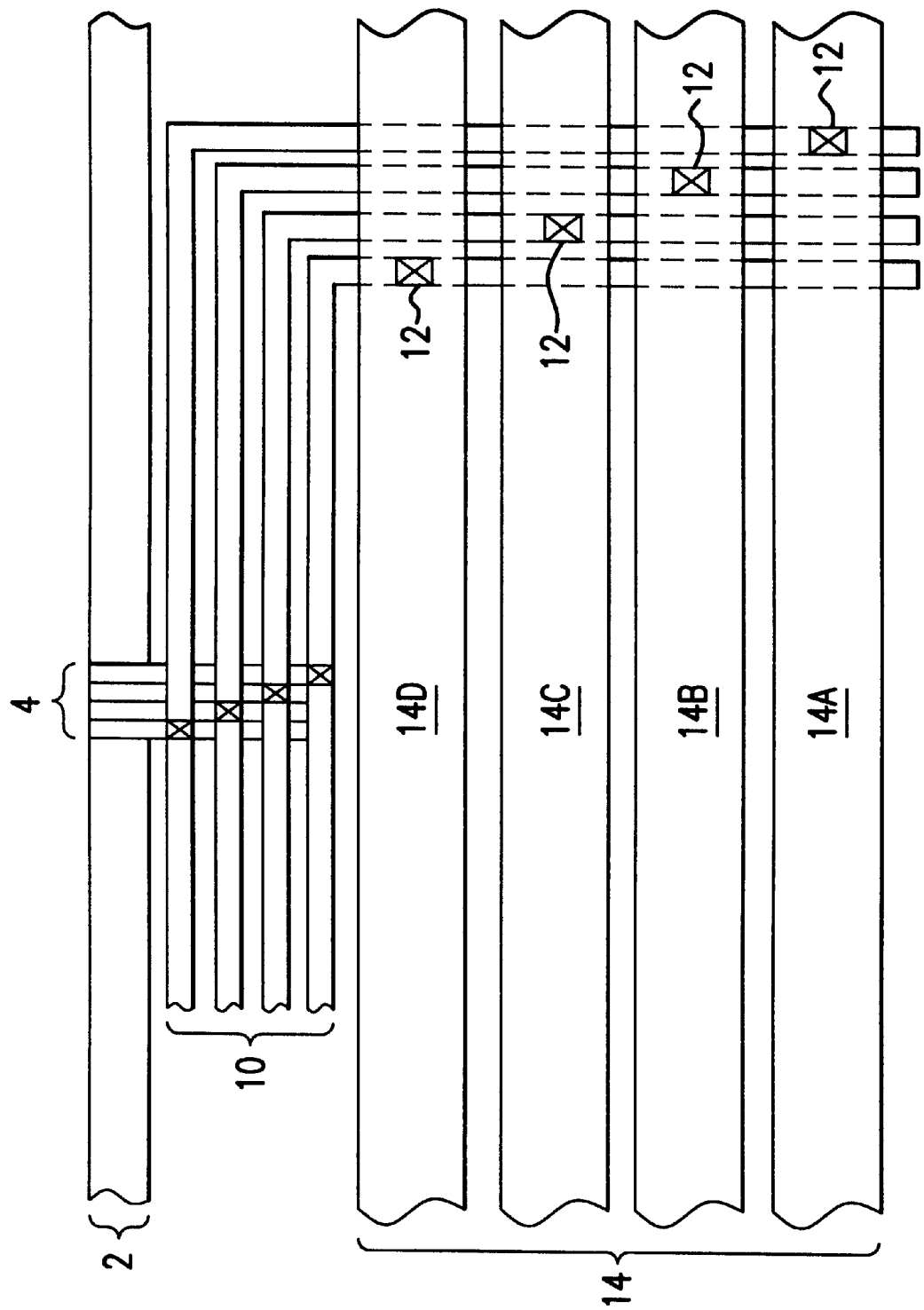
FIG. 2 is a layout diagram of a representative readout register element depicting the narrow metal-1 to wide metal-2 bus connection according to the present invention.

In FIG. 2 wide metal-2 clock busses 14 are depicted. As in FIG. 1, a representative register element 4 is depicted in buried channel 2 where four clock phases are connected to narrow metal-1 busses 10. In FIG. 2, narrow metal-1 busses 10 turn at right angles away from buried channel 2 and extend perpendicular, or at least transverse, to the longitudinal direction of buried channel 2. An insulation layer is formed over metal-1 busses and openings are formed in the insulation layer to provide metal to metal vias 12. Wide metal-2 busses are formed on the second insulation layer so as to make contact through vias 12 with the transverse end portions of narrow metal-1 clock busses 10. Metal-2 busses 14 are preferably 50 to 100 micrometers wide. Wide metal-2 busses are sized to have sufficiently reduced resistance to provide the desired clock speed operation over the entire length of the CCD shift register. Metal-2 busses 14 are formed preferably over an additional insulation layer so that their capacitance per unit area with respect to the substrate is reduced. In this way, clock signals can propagate rapidly down metal-2 clock busses 14. From there, the clock signals pass through metal to metal vias 12 into narrow metal-1 clock busses 10. From there, the clock signals pass through metal to poly-silicon vias 8 into gate electrodes 6A through 6D (FIG. 1).

Figure 3:
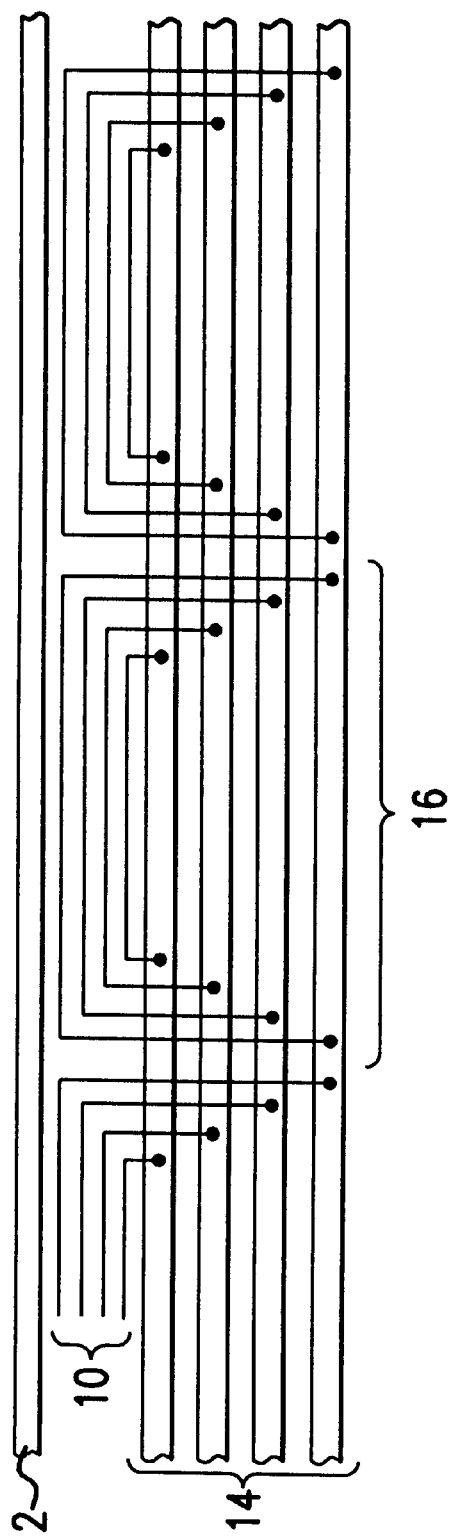
FIG. 3 is a layout diagram of a representative readout register portion depicting a repeating bus segment according to the present invention.

In FIG. 3, clock busses are preferably organized into repeating bus segments 16. A shift register will be formed with a plurality of these segments. Each segment will have its own plurality of sets of poly-silicon conductors. Each set of poly-silicon conductors includes a conductor for each phase. In the present exemplary embodiment there are four phases. For example, in a shift register that is 2048 elements long, repeating bus segment 16 may be only 256 register elements long. Thus, in the 2,048 element long shift register, there would be eight repeating bus segments 16. In each segment, there would be 256 sets of conductors, and each set of conductors would have one conductor for each phase.

Preferably, there are formed one or more layers of poly-silicon conductors. For example, adjacent gate electrodes 6A and 6B are typically formed in different poly-silicon layers. At each layer poly-silicon is deposited over an insulator, patterned and etched to form the needed conductors, all conductors in a layer being substantially co-planar. Then, an insulator is deposited, patterned and etched to form openings for vias. Then after all needed layers of poly-silicon conductors have been formed, a metal-1 layer is deposited, patterned and etched to form the metal-1 busses, all substantially co-planar. Then, another insulator is deposited, patterned and etched to form openings for vias. Then, a metal-2 layer is deposited, patterned and etched to form the metal-2 busses, all substantially co-planar.

Narrow clock busses 10 and transfer clock bus 36 are formed in the metal-1 layer. Normally, wide clock busses 14 and wide transfer clock bus 40 are formed in the metal-2 layer. The metal-2 layer has more insulation dielectric beneath it than does either the metal-i layer or the poly-silicon layer.

One variant that may be used when the process does not have a metal-2 layer is to form wide clock busses 14 and wide transfer clock bus 40 in the metal-1 layer. The metal-1 layer still has more insulation dielectric beneath it than does the poly-silicon layer. In this variant, it is necessary to provide inter-bus conductors that will couple wide clock busses 14 to narrow busses 10. Since there is no metal-2 layer, the inter-bus conductors are formed in the poly-silicon layer. Since the frequency of inter-bus conductors along the length of the shift register may be less than the frequency of shift register gate electrodes 6 along the capacitance experienced by each clock phase is less than would be experienced if clock busses 10 were made as wide as clock busses 14.

Another variant that may be used when the process has a metal-2 layer, but for other reasons long busses 14 and 40 must be avoided, is to form wide clock busses 14 and wide transfer clock bus 40 in the metal-1 layer. The metal-1 layer still has more insulation dielectric beneath it than does the poly-silicon layer. In this variant, it is necessary to provide inter-bus conductors that will couple wide clock busses 14 to narrow busses 10. These inter-bus conductors are formed in the metal-2 layer, where they less intrusive on the design than if they were long metal-2 busses 14 and 40 and where they may be oriented transverse to the longitudinal direction of buried channel 2.

Figure 4:
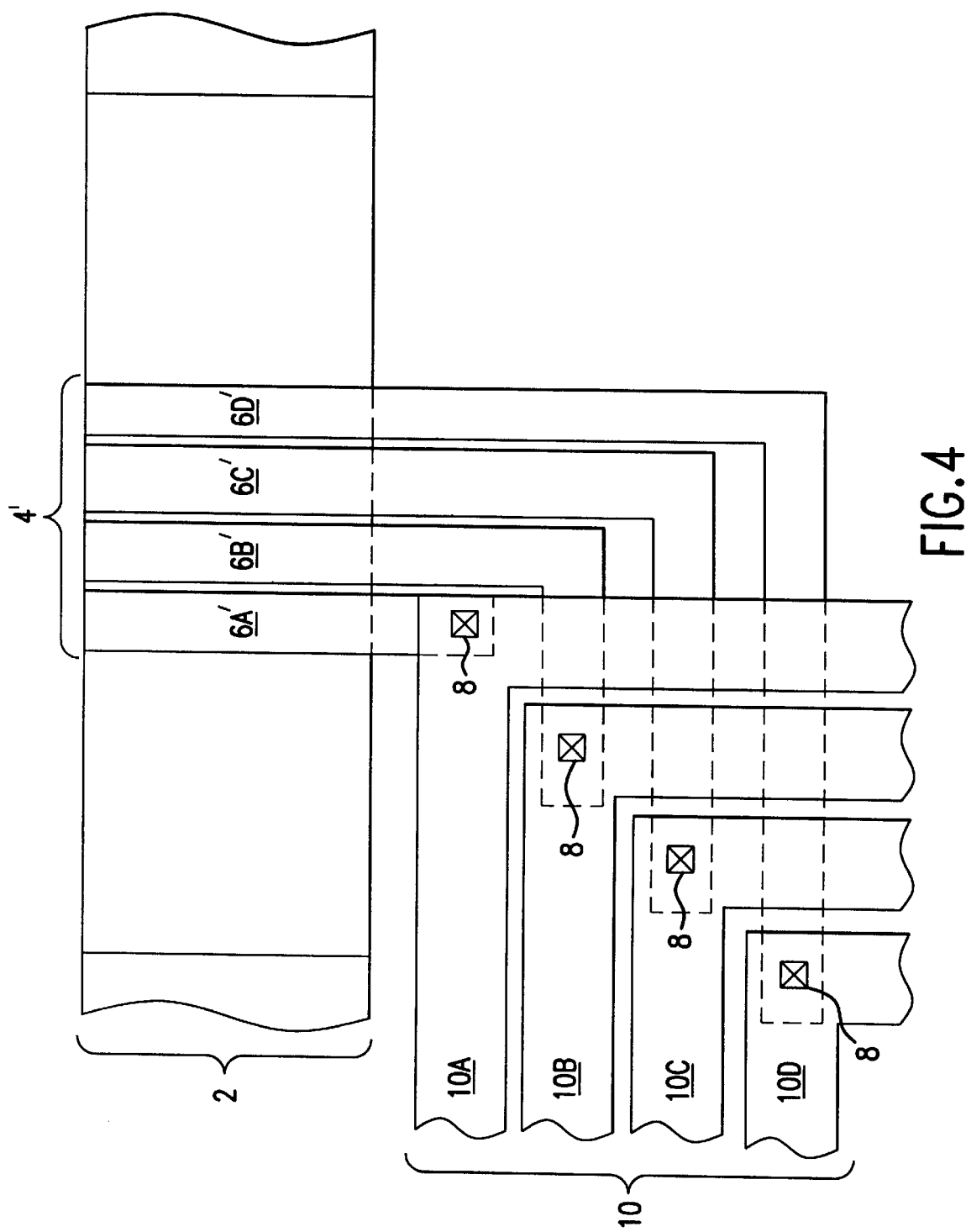
FIG. 4 is a layout diagram of a readout register element at an end of a segment depicting the gate electrode to metal-1 bus connection according to the present invention.

FIG. 4 shows an end treatment using special poly-silicon conductors 6A', 6B', 6C', and 6D'. In this special end treatment, the poly-silicon conductor is routed at right angles back under corresponding narrow metal-1 busses 10A–10D. Metal to poly-silicon vias 8 make a connection.

Figure 5:
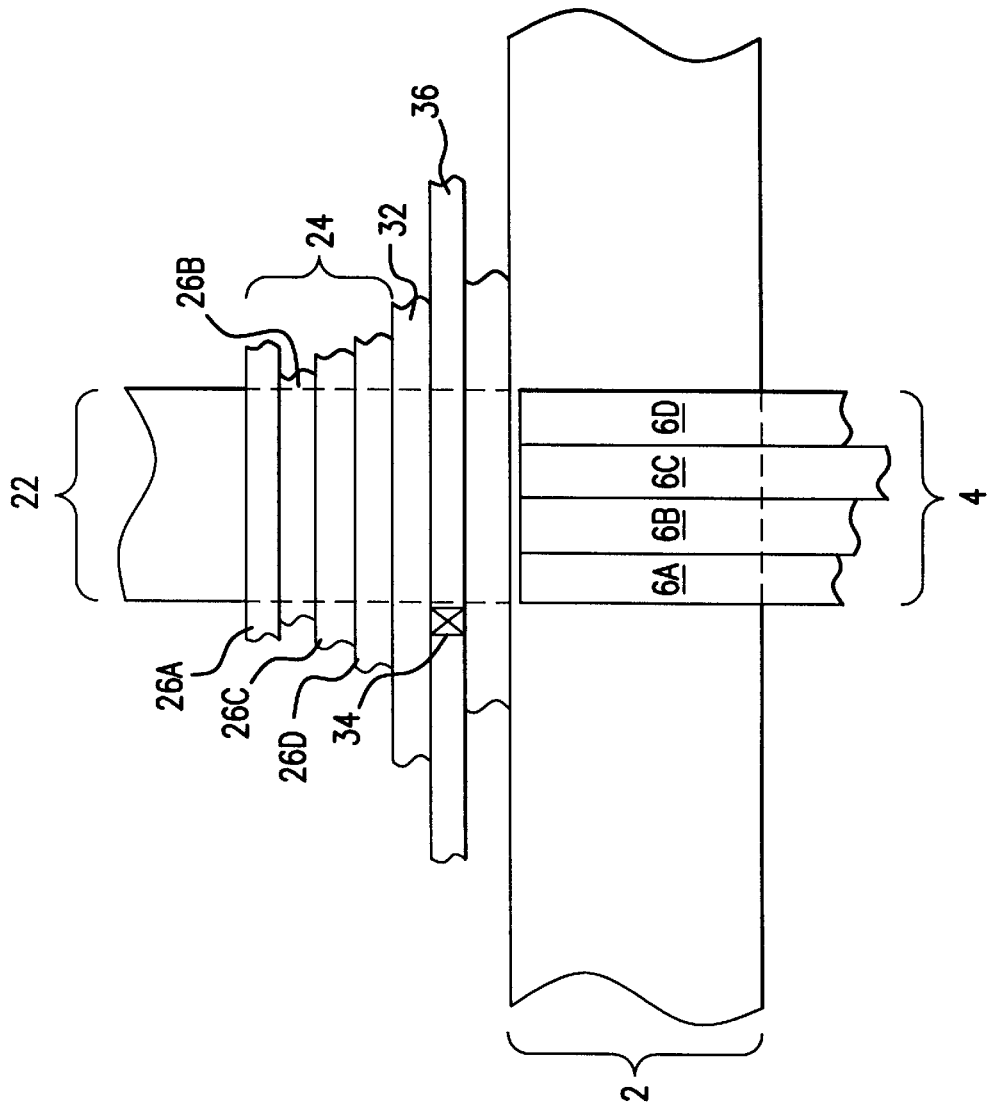
FIG. 5 is a layout diagram of a representative vertical shift register connection to a horizontal readout register element depicting a transfer gate electrode and metal-1 bus connection according to the present invention.

In FIG. 5, a vertical CCD shift register is formed with buried channel 22. A last element of the vertical CCD shift register is depicted at 24. Last element 24 is formed in buried channel 22 under poly-silicon gate electrodes 26A, 26B, 26C and 26D. Clock signals are applied to poly-silicon gate electrodes 26A–26D to transfer charge that is in last element 24 of the vertical CCD shift register through a transfer gate into horizontal CCD shift register element 4. Horizontal CCD shift register element 4 is formed in buried channel 2 under poly-silicon gate electrodes 6A–6D as described with respect to FIG. 1.

The transfer gate is formed in buried channel 22 under poly-silicon gate electrode 32. Poly-silicon gate electrode 32 extends along the entire longitudinal length of buried channel 2. It will be appreciated that when the horizontal CCD shift register formed in buried channel 2 is long, the capacitance and resistance of poly-silicon gate electrode 32 to a distribution of transfer clock signal TCK will be significant. In order to reduce the effective resistance of poly-silicon gate electrode 32 over the length of the horizontal shift register, metal-1 transfer clock bus 36 is formed over an insulation layer with periodic openings to form metal to poly-silicon via contacts 34 periodically along the length of electrode 32. Via contacts 34 are located in metal-1 transfer clock bus 36 at longitudinal positions corresponding to channel stop commonly used between vertical buried channels 22 in area sensors or TDI CCD linear sensors. This positioning avoids the undesirable potential well distortion effects as discussed above.

In a representative sensor, there may be, for example, 2,048 buried channels 22 so that the horizontal shift register formed in buried channel 2 includes 2,048 register elements. With such a long structure, even metal-1 transfer clock bus 36 will have significant (i.e., undesirable) resistance.

Figure 6:
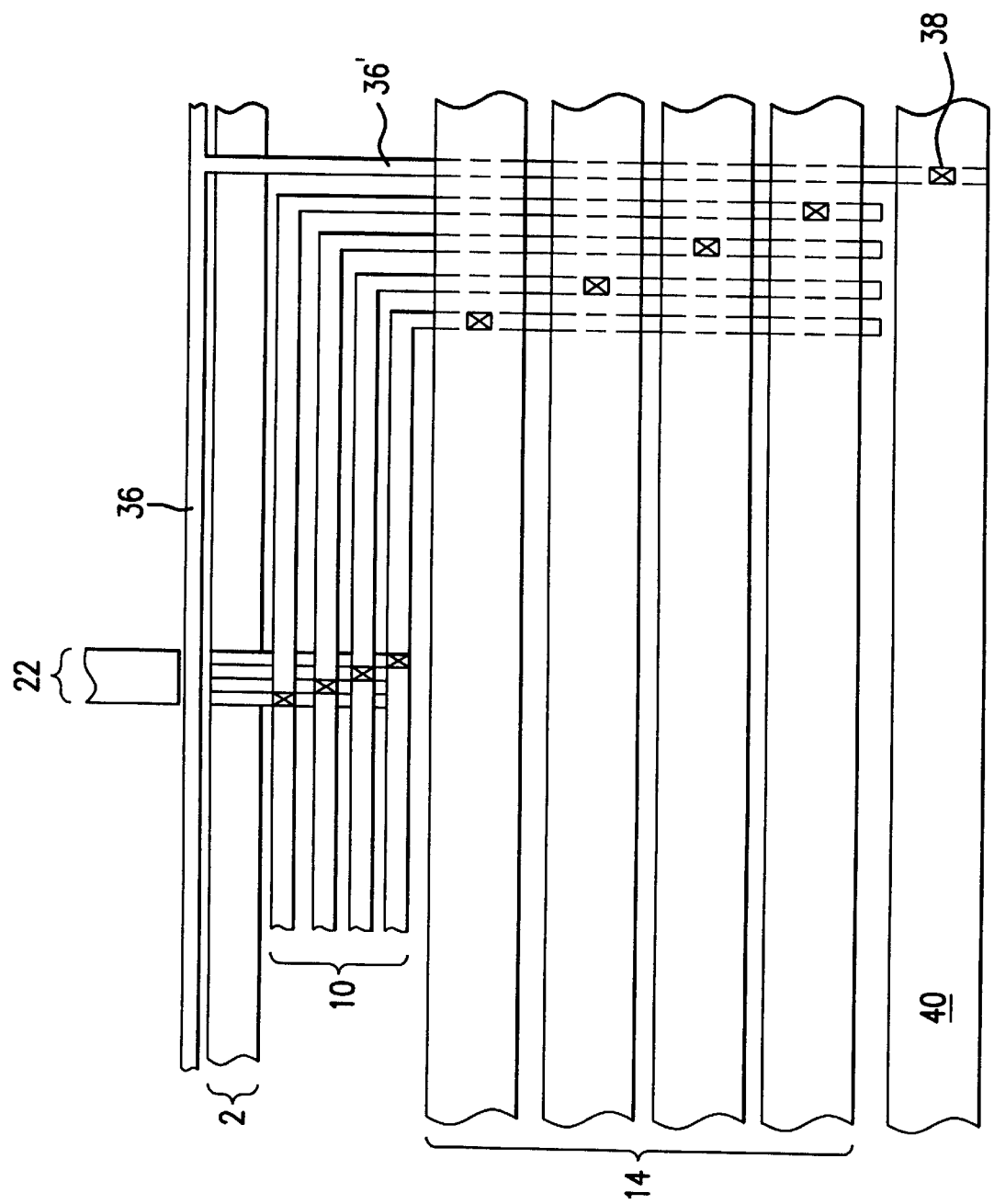
FIG. 6 is a layout diagram of a representative vertical register to readout register connection depicting the narrow metal-1 to wide metal-2 bus connection for the transfer clock bus according to the present invention.

FIG. 6 depicts an end section of a bus segment similar to FIG. 2. In FIG. 6, metal-1 transfer clock bus 36 includes a transverse or perpendicular extending bus portion 36' that crosses over buried channel 2 and parallels the transverse or perpendicular sections of metal-1 clock busses 10. From there, bus portion 36' passes under metal-2 clock busses 14 to a metal to metal via contact 38. Metal to metal via contact 38 connects transfer clock bus portion 36' to wide metal-2 transfer clock bus 40 which parallels wide metal-2 clock busses 14. Transfer clock bus portion 36' is disposed over and insulated from any poly-silicon conductors including the gate electrodes disposed over buried channel 2. Thus, as can be seen in FIG. 4, there is room for transfer clock bus portion 36' to pass over buried channel 2 and parallel the transverse or perpendicular portions of metal-1 clock busses 10.

Figure 7:
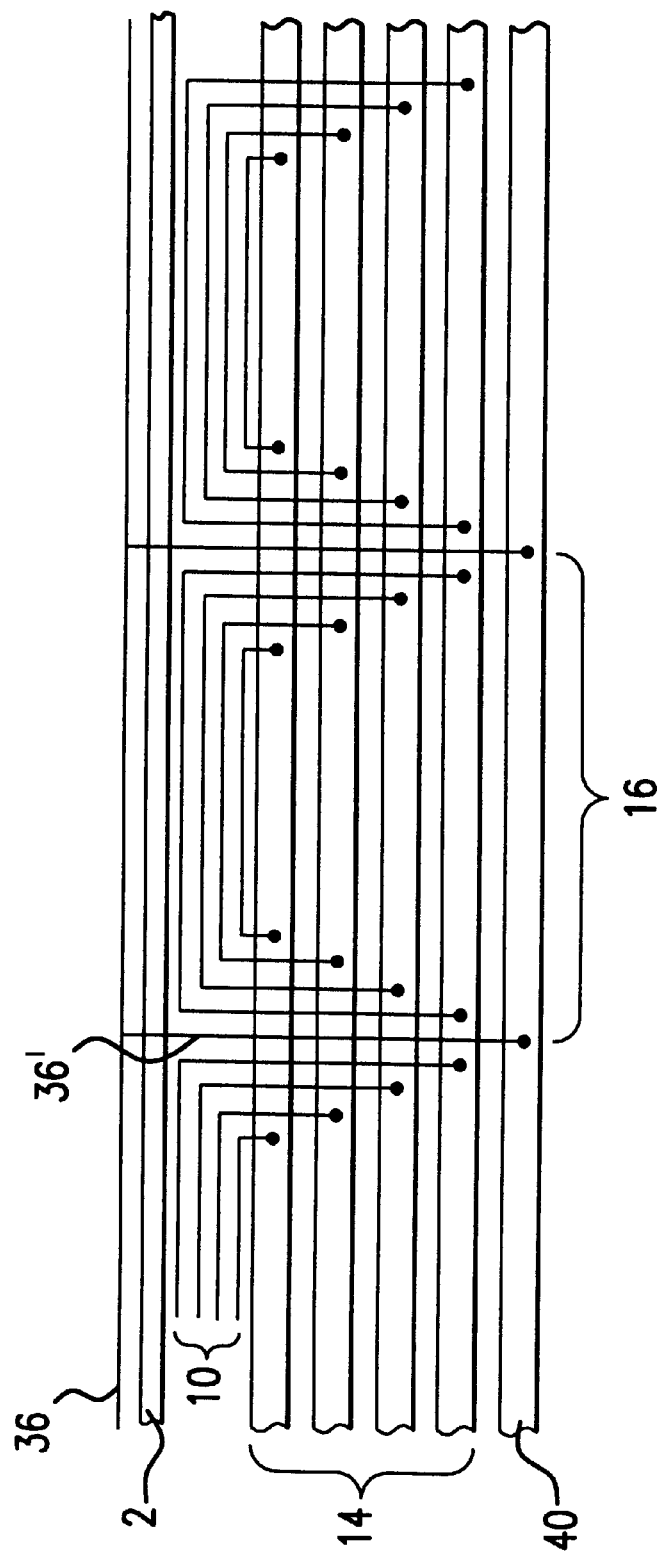
FIG. 7 is a layout diagram of a representative readout register portion depicting a repeating bus segment that includes a connection between the transfer clock metal-1 bus and the transfer clock metal-2 bus according to the present invention.

In FIG. 7, repeating bus segment 16 further includes wide metal-2 transfer clock bus 40, metal-1 transfer clock bus 36 and metal-1 transfer clock bus portion 36' extending between the metal-1 busses of two adjacent segments of metal-1 clock busses 10.

Thus, it is possible to provide clock signals A–D and transfer clock TCK on pads at the edge of the sensor chip, distribute these clocks through wide busses 14 and 40 at low resistance and periodically connect them to narrow busses 10 and 36 so as to provide improved clocking speeds.

Figure 8:
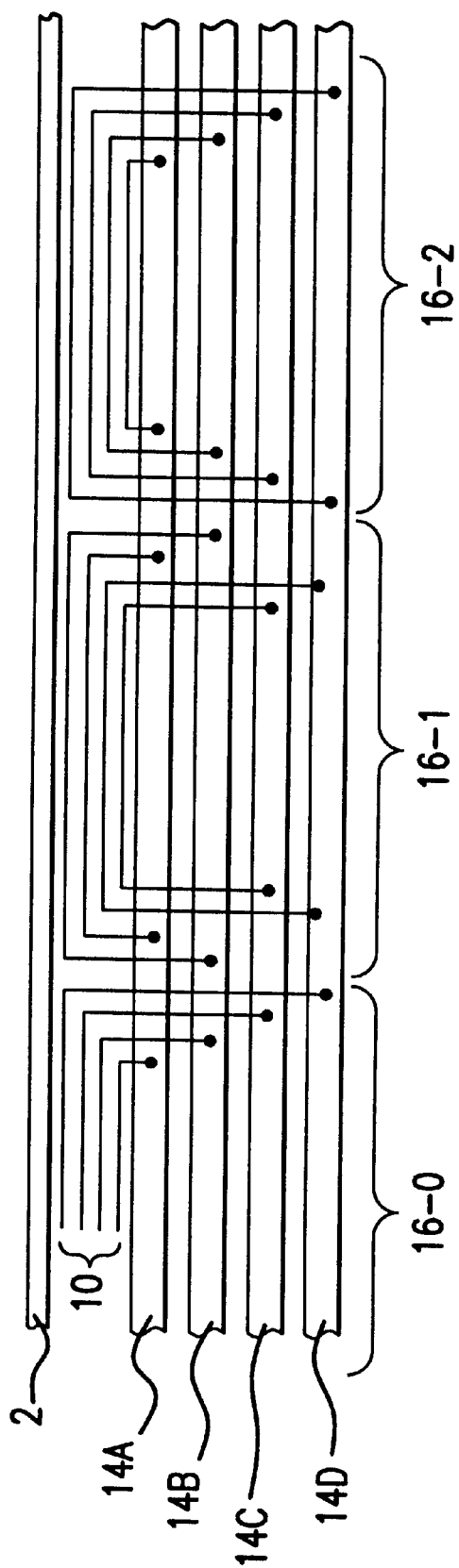
FIG. 8 is a layout diagram of two representative readout register portions depicting narrow bus swapping within repeating bus segments according to the present invention.
Figure 9:
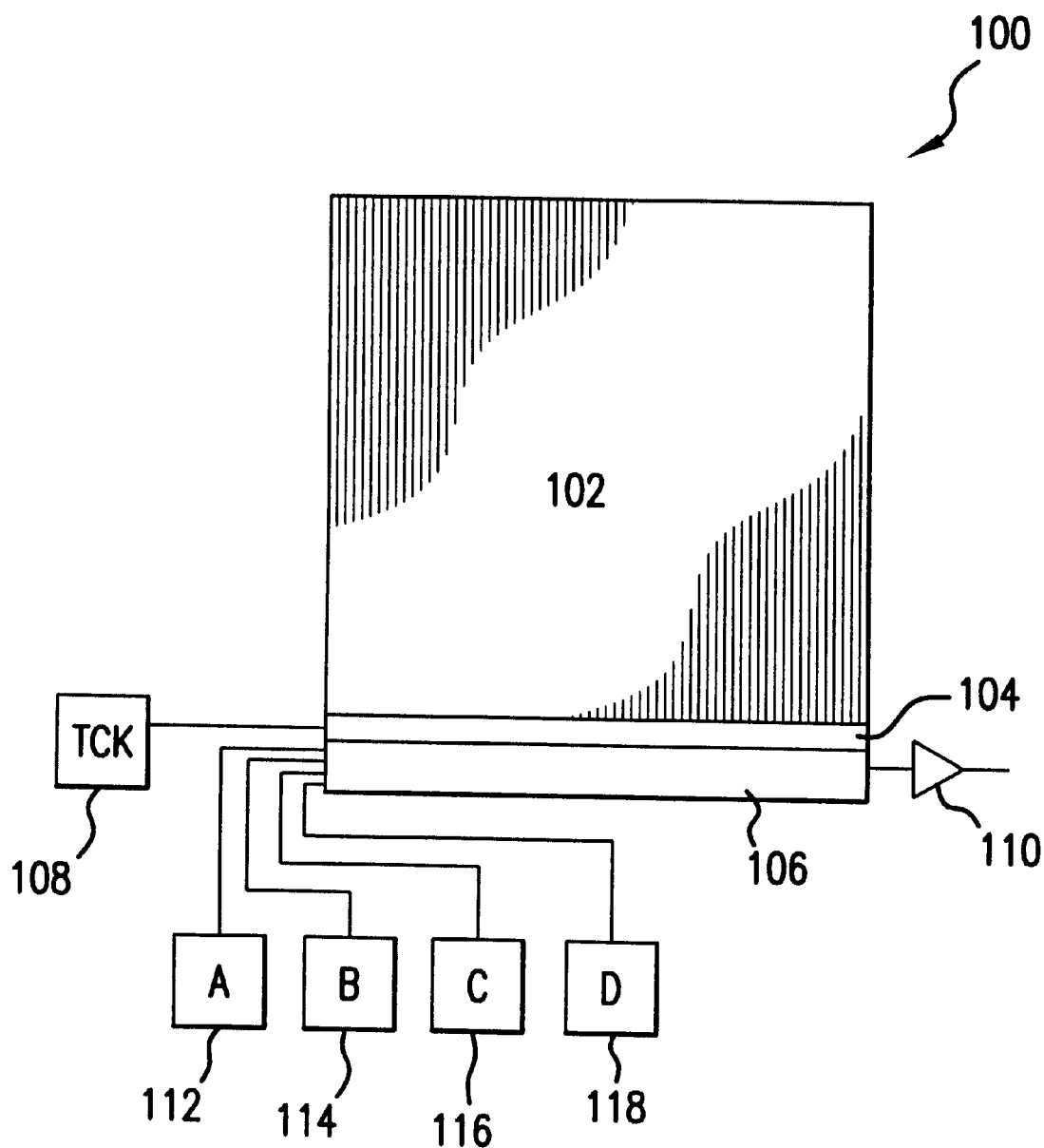
FIG. 9 is a block diagram of a known TDI CCD sensor.

In another variant depicted in FIG. 8, in first segment 16-1 of narrow clock busses 10, clock phases A and B are assigned to the two busses of busses 10 that are closest to buried channel 2 and clock phases C and D are assigned to the two busses of busses 10 that are farthest from buried channel 2. Then, in second segment 16-2 of narrow clock busses 10, clock phases A and B are assigned to the two busses of busses 10 that are farthest from buried channel 2 and clock phases C and D are assigned to the two busses of busses 10 that are closest to buried channel 2. In this way, over the whole of the shift register, the capacitive load (primarily due to the length of poly-silicon conductor from a bus of busses 10 to the gate electrode over buried channel 2) experienced by each of the clock phases will be equalized. In a four phase clock system, it is sufficient to interchange the busses that carry phases A and B with the busses that carry phases C and D as can be understood by studying FIGS. 1 and 8 since the area of the poly-silicon conductors are proportional to their capacitance. In two phase clock systems, it is only possible to interchange the two busses, that is the busses that carry clock phases A and B. In a three phase system, balancing the capacitive load experienced by the clock signals involves cyclically rotating the busses that carry the three phases from the closest to buried channel 2 to the farthest from buried channel 2.

It should be noted that a two level bus may seem similar to the bussing arrangement employed in tapped CCD sensors. However, the tapped CCD consists of distinct and physically separated HCCDs sections, each with its own output. The bussing arrangement employed in tapped CCD sensors is employed for physical layout considerations. In this invention, the two-level bus scheme is employed on a single continuous HCCD to improve operating speed by providing faster distribution of clock signals. The re-ordering of the narrow metal-1 busses in different segments (16 of FIG. 3) to uniformly distribute the capacitive load on any clock phase is not found in tapped-CCD structures. The connection of metal-1 transfer clock bus 36 to wide transfer clock bus 40 is not found in tapped-CCD structures.

Having described preferred embodiments of a novel CCD readout bussing structure of a CCD imaging device (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims:

What is claimed is:

1. A clock distribution structure comprising:
   a plurality of conductor segments, each conductor segment including a plurality of sets, each set including a plurality of conductors, each conductor corresponding to a respective clock signal of a plurality of clock signals and extending across a buried channel of a CCD shift register;
   a plurality of narrow bus segments, the plurality of narrow bus segments including a first narrow bus segment, the first narrow bus segment including plurality of narrow busses that are disposed parallel to and offset from the buried channel, each narrow bus corresponding to a respective clock signal of the plurality of clock signals and being coupled to a respective conductor of each set of a first conductor segment; and
   a plurality of wide busses, each wide bus corresponding to a respective signal of the plurality of clock signals and being coupled to a respective narrow bus of the first narrow bus segment, each wide bus being more conductive than any narrow bus.

2. The structure of claim 1, wherein the plurality of narrow bus segments further includes a second narrow bus segment, the second narrow bus segment including a plurality of narrow busses that are disposed parallel to and offset from the buried channel, each narrow bus corresponding to a respective clock signal of the plurality of clock signals and being coupled to a respective conductor of each set of a second conductor segment, each wide bus being coupled through a plurality of connections to a respective narrow bus of the second narrow bus segment.

3. The structure of claim 2, wherein the clock distribution structure further includes:
   a transfer clock gate electrode and a transfer clock bus coupled to the transfer clock gate electrode, the transfer clock bus including a transverse bus portion disposed between the busses of the first and second narrow bus segments; and
   a wide transfer clock bus coupled to the transverse bus portion.

4. The structure of claim 3, wherein the busses of the first and second narrow bus segments and the transfer clock bus are co-planar.

5. The structure of claim 3, wherein:
   the busses of the first and second narrow bus segments and the transfer clock bus are co-planar and disposed in a first plane; and
   the plurality of wide busses and the wide transfer clock bus are co-planer and disposed in a second plane, the first and second planes being parallel and non-intersecting.

6. The structure of claim 3, wherein:
   the busses of the first and second narrow bus segments and the transfer clock bus and the plurality of wide busses and the wide transfer clock bus are co-planar and disposed in a first plane;
   each wide bus is coupled to a respective narrow bus of the first and second narrow bus segments through a respective plurality of inter-bus conductors, the plurality of inter-bus conductors that correspond to a first wide bus being disposed in a second plane, the first and second planes being parallel and non-intersecting; and
   the wide transfer clock bus is coupled to the transverse bus portion through a plurality of transfer bus conductors, the plurality of transfer bus conductors being disposed in the second plane.

7. The structure of claim 6, wherein the plurality of conductor segments are disposed in the second plane.

8. The structure of claim 6, wherein the plurality of conductor segments are disposed in a third plane, the first and third planes being parallel and non-intersecting, the second and third planes being parallel and non-intersecting.

9. The structure of claim 2, wherein:
   the plurality of narrow busses of the first narrow bus segment includes first and second busses of the first narrow bus segment, the first bus of the first narrow bus segment being closer to the buried channel than the second bus of the first narrow bus segment; and
   the plurality of narrow busses of the second narrow bus segment includes first and second busses of the second narrow bus segment, the second bus of the second narrow bus segment being closer to the buried channel than the first bus of the second narrow bus segment, the first bus of the first narrow bus segment being electrically coupled to the first bus of the second narrow bus segment.

10. The structure of claim 1, wherein:
    the busses of the first narrow bus segment and the plurality of wide busses are co-planar and disposed in a first plane; and
    each wide bus is coupled to a respective narrow bus of the first narrow bus segment through a respective plurality of inter-bus conductors, the plurality of inter-bus conductors that correspond to a first wide bus being disposed in a second plane, the first and second planes being parallel and non-intersecting.

11. The structure of claim 10, wherein the plurality of conductor segments are disposed in the second plane.

12. The structure of claim 10, wherein the plurality of conductor segments are disposed in a third plane, the first and third planes being parallel and non-intersecting, the second and third planes being parallel and non-intersecting.

13. A CCD shift register comprising:
    a continuous buried channel over a length of the shift register;
    a plurality of conductor segments, each conductor segment including a plurality of sets, each set including a plurality of conductors, each conductor corresponding to a respective clock signal of a plurality of clock signals and extending across the buried channel;
    a plurality of narrow bus segments, the plurality of narrow bus segments including a first narrow bus segment, the first narrow bus segment including a plurality of narrow busses that are disposed parallel to and offset from the buried channel, each narrow bus corresponding to a respective clock signal of the plurality of clock signals and being coupled to a respective conductor of each set of a first conductor segment; and
    a plurality of wide busses, each wide bus corresponding to a respective signal of the plurality of clock signals and being coupled to a respective narrow bus of the first narrow bus segment, each wide bus being more conductive than any narrow bus.

14. The register of claim 13, wherein the plurality of narrow bus segments further includes a second narrow bus segment, the second narrow bus segment including a plurality of narrow busses that are disposed parallel to and offset from the buried channel, each narrow bus corresponding to a respective clock signal of the plurality of clock signals and being coupled to a respective conductor of each set of a second conductor segment, each wide bus being coupled to a respective narrow bus of the second narrow bus segment.

15. The register of claim 14, wherein the clock distribution structure further includes:
a transfer clock gate electrode and a transfer clock bus coupled to the transfer clock gate electrode, the transfer clock bus including a transverse bus portion disposed between the busses of the first and second narrow bus segments; and
a wide transfer clock bus coupled to the transverse bus portion.

16. The register of claim 15, wherein the busses of the first and second narrow bus segments and the transfer clock bus are co-planar.

17. The register of claim 15, wherein:
the busses of the first and second narrow bus segments and the transfer clock bus are co-planar and disposed in a first plane; and
the plurality of wide busses and the wide transfer clock bus are co-planer and disposed in a second plane, the first and second planes being parallel and non-intersecting.

18. The register of claim 15, wherein:
the busses of the first and second narrow bus segments and the transfer clock bus and the plurality of wide busses and the wide transfer clock bus are co-planar and disposed in a first plane;
each wide bus is coupled to a respective narrow bus of the first and second narrow bus segments through a respective plurality of inter-bus conductors, the plurality of inter-bus conductors that correspond to a first wide bus being disposed in a second plane, the first and second planes being parallel and non-intersecting; and
the wide transfer clock bus is coupled to the transverse bus portion through a plurality of transfer bus conductors, the plurality of transfer bus conductors being disposed in the second plane.

19. The register of claim 18, wherein the plurality of conductor segments are disposed in the second plane.

20. The register of claim 18, wherein the plurality of conductor segments are disposed in a third plane, the first and third planes being parallel and non-intersecting, the second and third planes being parallel and non-intersecting.

21. The register of claim 14, wherein:
the plurality of narrow busses of the first narrow bus segment includes first and second busses of the first narrow bus segment, the first bus of the first narrow bus segment being closer to the buried channel than the second bus of the first narrow bus segment; and
the plurality of narrow busses of the second narrow bus segment includes first and second busses of the second narrow bus segment, the second bus of the second narrow bus segment being closer to the buried channel than the first bus of the second narrow bus segment, the first bus of the first narrow bus segment being electrically coupled to the first bus of the second narrow bus segment.

22. The register of claim 13, wherein:
the busses of the first narrow bus segment and the plurality of wide busses are co-planar and disposed in a first plane; and
each wide bus is coupled to a respective narrow bus of the first narrow bus segment through a respective plurality of inter-bus conductors, the plurality of inter-bus conductors that correspond to a first wide bus being disposed in a second plane, the first and second planes being parallel and non-intersecting.

23. The register of claim 22, wherein the plurality of conductor segments are disposed in the second plane.

24. The register of claim 22, wherein the plurality of conductor segments are disposed in a third plane, the first and third planes being parallel and non-intersecting, the second and third planes being parallel and non-intersecting.

25. A method of forming a clock distribution structure for a shift register comprising steps of:
forming a continuous buried channel over a length of the shift register;
forming a plurality of conductor segments, each conductor segment including a plurality of sets, each set including a plurality of conductors, each conductor corresponding to a respective clock signal of a plurality of clock signals and extending across the buried channel;
forming a plurality of narrow bus segments, the plurality of narrow bus segments including a first narrow bus segment, the first narrow bus segment including a plurality of narrow busses that are disposed parallel to and offset from the buried channel, each narrow bus corresponding to a respective clock signal of the plurality of clock signals and being coupled to a respective conductor of each set of a first conductor segment; and
forming a plurality of wide busses, each wide bus corresponding to a respective signal of the plurality of clock signals and being coupled to a respective narrow bus of the first narrow bus segment, each wide bus being more conductive than any narrow bus.

26. The method of claim 25, wherein the step of forming a plurality of narrow bus segments further forms a second narrow bus segment, the second narrow bus segment including a plurality of narrow busses that are disposed parallel to and offset from the buried channel, each narrow bus corresponding to a respective clock signal of the plurality of clock signals and being coupled to a respective conductor of each set of a second conductor segment, each wide bus being coupled to a respective narrow bus of the second narrow bus segment.

27. The method of claim 26, wherein the method further includes steps of:
forming a transfer clock gate electrode and a transfer clock bus coupled to the transfer clock gate electrode, the transfer clock bus including a transverse bus portion disposed between the busses of the first and second narrow bus segments; and
forming a wide transfer clock bus coupled to the transverse bus portion.

28. The method of claim 27, wherein the steps of forming a plurality of narrow bus segments and forming a transfer clock bus form the busses of the first and second narrow bus segments and the transfer clock bus so as to be co-planar.

29. The method of claim 27, wherein:
the steps of forming a plurality of narrow bus segments and forming a transfer clock bus form the busses of the first and second narrow bus segments and the transfer clock bus so as to be co-planar and disposed in a first plane; and
the steps of forming a plurality of wide busses and forming a wide transfer clock bus form the plurality of wide busses and the wide transfer clock bus so as to be co-planer and disposed in a second plane, the first and second planes being parallel and non-intersecting.

30. The method of claim 27, wherein the steps of forming a plurality of narrow bus segments and forming a transfer clock bus and forming a plurality of wide busses and forming a wide transfer clock bus form the busses of the first and second narrow bus segments and the transfer clock bus and the plurality of wide busses and the wide transfer clock bus so as to be co-planar and disposed in a first plane, each wide bus being coupled to a respective narrow bus of the first and second narrow bus segments through a respective plurality of inter-bus conductors, the plurality of inter-bus conductors that correspond to a first wide bus being disposed in a second plane, the first and second planes being parallel and non-intersecting, the wide transfer clock bus being coupled to the transverse bus portion through a plurality of transfer bus conductors, the plurality of transfer bus conductors being disposed in the second plane.

31. The method of claim 30, wherein the plurality of conductor segments are disposed in the second plane.

32. The method of claim 30, wherein the plurality of conductor segments are disposed in a third plane, the first and third planes being parallel and non-intersecting, the second and third planes being parallel and non-intersecting.

33. The method of claim 26, wherein the step of forming a plurality of narrow bus segments forms:

the plurality of narrow busses of the first narrow bus segment to include first and second busses of the first narrow bus segment, the first bus of the first narrow bus segment being closer to the buried channel than the second bus of the first narrow bus segment; and the plurality of narrow busses of the second narrow bus segment to include first and second busses of the second narrow bus segment, the second bus of the second narrow bus segment being closer to the buried channel than the first bus of the second narrow bus segment, the first bus of the first narrow bus segment being electrically coupled to the first bus of the second narrow bus segment.

34. The method of claim 25, wherein the steps of forming a plurality of narrow bus segments and forming a plurality of wide busses form the busses of the first narrow bus segment and the plurality of wide busses so as to be co-planar and disposed in a first plane, each wide bus being coupled to a respective narrow bus of the first narrow bus segment through a respective plurality of inter-bus conductors, the plurality of inter-bus conductors that correspond to a first wide bus being disposed in a second plane, the first and second planes being parallel and non-intersecting.

35. The method of claim 34, wherein the plurality of conductor segments are disposed in the second plane.

36. The method of claim 34, wherein the plurality of conductor segments are disposed in a third plane, the first and third planes being parallel and non-intersecting, the second and third planes being parallel and non-intersecting.

* * * * *